United States Patent
Kikuchi et al.

(10) Patent No.: US 10,916,428 B2
(45) Date of Patent: Feb. 9, 2021

(54) METHOD TO TRANSFER PATTERNS TO A LAYER

(71) Applicant: Tokyo Electron Limited, Tokyo (JP)

(72) Inventors: Yuki Kikuchi, Albany, NY (US);
Toshiharu Wada, Albany, NY (US);
Kaoru Maekawa, Albany, NY (US);
Akiteru Ko, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/290,580

(22) Filed: Mar. 1, 2019

(65) Prior Publication Data

US 2020/0020534 A1 Jan. 16, 2020

Related U.S. Application Data (60) Provisional application No. 62/666,751, filed on May 4, 2018, provisional application No. 62/637,743, filed on Mar. 2, 2018.

(51) Int. Cl.
*H01L 21/033* (2006.01)

(52) U.S. Cl.
CPC ...... *H01L 21/0338* (2013.01); *H01L 21/0335* (2013.01); *H01L 21/0337* (2013.01)

(58) Field of Classification Search
CPC ............ H01L 21/0338; H01L 21/0335; H01L 21/0337; H01L 21/00; H01L 21/0271; H01L 21/76828; H01L 21/266; H01L 21/76802
See application file for complete search history.

(56) References Cited

U.S. PATENT DOCUMENTS

| | | | | |
|---|---|---|---|---|
| 4,519,872 A | * | 5/1985 | Anderson, Jr. | ......... G03F 7/039 |
| | | | | 204/192.32 |
| 8,765,512 B2 | | 7/2014 | Kohl et al. | |
| 9,177,796 B2 | * | 11/2015 | Bencher | ............. H01L 21/0276 |

(Continued)

FOREIGN PATENT DOCUMENTS

| | | |
|---|---|---|
| JP | 2002-280308 A | 12/2002 |
| JP | 2005-156999 A | 6/2005 |

(Continued)

OTHER PUBLICATIONS

Of Brydson et al., "Aminoplastics", Urea Formaldehyde Resins, Polyurethane Polymers, 2017 Science Direct, pp. 668-693 (Dec. 2017).*

(Continued)

*Primary Examiner* — Nikolay K Yushin
(74) *Attorney, Agent, or Firm* — Rothwell, Figg, Ernst & Manbeck, P.C.

(57) ABSTRACT

A process is provided in which a patterned layer, an intervening layer and a first layer to be etched according to the pattern of the patterned layer are formed. The intervening layer may be a thermal decomposition layer that may be removed by a heat based removal process. After etching the first layer, the use of a heat based removal process may allow the intervening layer to be removed from the substrate without altering the first layer. In one embodiment, the first layer may be a memorization layer and the process may be a multiple patterning process.

19 Claims, 6 Drawing Sheets

(56) References Cited

U.S. PATENT DOCUMENTS

| | | | |
|---|---|---|---|
| 10,205,052 B2* | 2/2019 | Yoon | H01L 33/22 |
| 2014/0327117 A1* | 11/2014 | Bencher | C23C 14/0042 |
| | | | 257/649 |
| 2017/0271556 A1* | 9/2017 | Yoon | H01L 33/22 |

FOREIGN PATENT DOCUMENTS

| | | |
|---|---|---|
| KR | 10-1360548 B1 | 2/2014 |
| KR | 10-1772726 B1 | 8/2017 |

OTHER PUBLICATIONS

International Search Report issued in Application No. PCT/US2019/020031 dated Jun. 11, 2019 (3 pages).

* cited by examiner

METHOD TO TRANSFER PATTERNS TO A LAYER

This application claims priority to U.S. Provisional Patent Application No. 62/637,743, entitled, "Method to Transfer Patterns to a Layer," filed Mar. 2, 2018 and U.S. Provisional Patent Application No. 62/666,751, entitled, "Method to Transfer Patterns to a Layer," filed May 4, 2018; the disclosures of which are expressly incorporated herein, in their entirety, by reference.

BACKGROUND

The present disclosure relates to the processing of substrates. In particular, it provides a method for patterning of substrates.

The use of photolithography techniques for the processing of substrates has long been known. Historically, photolithography has involved the formation of a pattern in a layer, for example a photoresist layer, and then transferring that patterning to another layer via an etch process.

As critical dimensions of features formed on substrates continue to shrink, multiple patterning techniques have been used to such that critical dimensions smaller than achievable with one pattern may be achieved. Thus, for example, the use of double patterning processes, triple patterning processing, quadruple patterning processes, etc. is now known. In one example of such processes, multiple patterns are sequentially patterned and then etched in an etched layer to achieve a final desired pattern in the etched layer of the substrate. For example, a first photolithographic pattern may be formed in a photoresist layer and then transferred to the etched layer of the substrate via an etch process. In one example the etched layer may be a memorization layer of a multiple patterning process (for example a double patterning process). Then, a second photolithographic pattern may be formed in a photoresist layer and transferred to the same etched layer (for example the memorization layer) via another etch process. In this manner, two photolithography patterns may be transferred to the etched layer (for example a memorization layer), with critical dimensions smaller than achievable by the use of just one photolithography layer.

However, it has been found that performance of multiple process steps upon the etched layer in which the final pattern is to be made (for example the memorization layer) may cause unwanted damage to the etched layer. In one embodiment, other layers (including planarization layers) may be formed between the photoresist layer and the etched layer as part of the photolithography process flow. Such other layers may be removed from the substrate after the first etching of the etched layer. In one example, the other layers may include a planarization layer. As known in the prior art, after the first pattern is formed in the etched layer, a first planarization layer may be removed from the substrate. Then, prior to coating the substrate with the second photoresist layer, another planarization layer may be formed on the substrate. Typical materials used for the planarization layer include organic planarization layers.

As described herein, it has been found that the removal of the first planarization layer may cause unwanted damage to the etched layer. Thus, it would be desirable to utilize a process in which a material may be removed from an etched layer without causing unwanted changes to the etched layer.

SUMMARY

A process is provided in which a patterned layer, an intervening layer and a first layer to be etched according to the pattern of the patterned layer are formed. The intervening layer may be a thermal decomposition layer that may be removed by a heat based removal process. After etching the first layer, the use of a heat based removal process may allow the intervening layer to be removed from the substrate without altering the first layer. In one embodiment, the first layer may be a memorization layer and the process may be a multiple patterning process.

In one embodiment, a method of etching a substrate is provided. The method may comprise providing a first layer on the substrate, providing a first patterned layer having a first pattern on the substrate, and providing one or more intervening layers between the first patterned layer and the first layer, at least one intervening layer being a first thermal decomposition layer. The method further comprises etching the first layer to form the first pattern in the first layer, and removing the first thermal decomposition layer by applying thermal energy to the first thermal decomposition layer.

In another embodiment, a method of patterning a substrate is provided. The method may comprise providing the substrate with a structure comprising a photo resist patterned layer, a first thermal decomposition layer, and a memorization layer, a pattern of the photo resist patterned layer comprising lines, spaces and/or vias. The method may further comprise performing a pattern transfer of spaces and/or vias of the pattern to the memorization layer while leaving the lines of the pattern on the thermal decomposition layer, and performing a first heat treatment process to remove any remaining portion of the first thermal decomposition layer.

In yet another embodiment, a method of multi-patterning a substrate is provided. The method may comprise providing the substrate with a structure comprising a first patterned layer, the first patterned layer have a first pattern, and providing a memorization layer. The method further comprise providing a first thermal decomposition layer between the first patterned layer and the memorization layer, the first thermal decomposition layer being a first planarization layer, and performing a first pattern transfer to transfer the first pattern to the memorization layer. The method further comprises removing the first thermal decomposition layer by applying thermal energy to the first thermal decomposition layer. After removing the first thermal decomposition layer, the method comprises providing a second thermal decomposition layer, wherein the second thermal decomposition layer is a second planarization layer. The method further comprises providing a second patterned layer such that the second thermal decomposition layer is between the second patterned layer and the memorization layer, wherein the second patterned layer has a second pattern. The method also comprises performing a second pattern transfer to transfer the second pattern to the memorization layer, and removing the second thermal decomposition layer by applying thermal energy to the second thermal decomposition layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

A process is provided in which a patterned layer, an intervening layer and a first layer to be etched according to the pattern of the patterned layer are formed. The intervening layer may be a thermal decomposition layer that may be removed by a heat based removal process. After etching the first layer, the use of a heat based removal process may allow the intervening layer to be removed from the substrate without altering the first layer. In one embodiment, the first layer may be a memorization layer and the process may be a multiple patterning process.

In an embodiment, the process may be used as part of a multiple patterning process. However, it will be recognized that the advantages of removing an intervening layer without damage to an etched layer may be desirably used in a wide range of substrate processing steps, and the techniques described herein are not limited to the use of a multiple patterning process. In one exemplary embodiment of use of the techniques described herein, the etched layer may be a memorization layer, however the techniques are not limited to use with memorization layers. In one exemplary embodiment, the intervening layer may be a planarization layer utilized to planarize the substrate prior to coating the substrate with a photoresist layer. In another exemplary embodiment, the pattern transfer process may be a multiple patterning process, the intervening layer may be a planarization layer and the etched layer may be a memorization layer.

The heat based removal process for removing the intervening layer is not limited to a specific heat based removal mechanism. For example, in one embodiment energy thermal energy may be provided to the intervening layer by providing thermal energy to the ambient surrounding the intervening layer. In another embodiment, electromagnetic energy may be used to provide thermal energy to the intervening layer, for example in one embodiment, a laser may be used to heat the intervening layer or in another embodiment microwave energy. It will be recognized that other methods may be used to heat the intervening layer such that a heat based removal mechanism is achieved.

In one embodiment, the intervening layer is a thermal decomposition material. As used herein, such material may decompose through, at least in part, the application of thermal energy to the material so that the material may be removed from the substrate via the application of thermal energy. The thermal energy may be applied to the thermal decomposition material in a variety of manners. For example, heating of the ambient around the decomposition material is one manner of applying thermal energy. In another example, a laser, microwave or other electromagnetic energy may be used to create thermal energy in the thermal decomposition material.

Figure 1A:
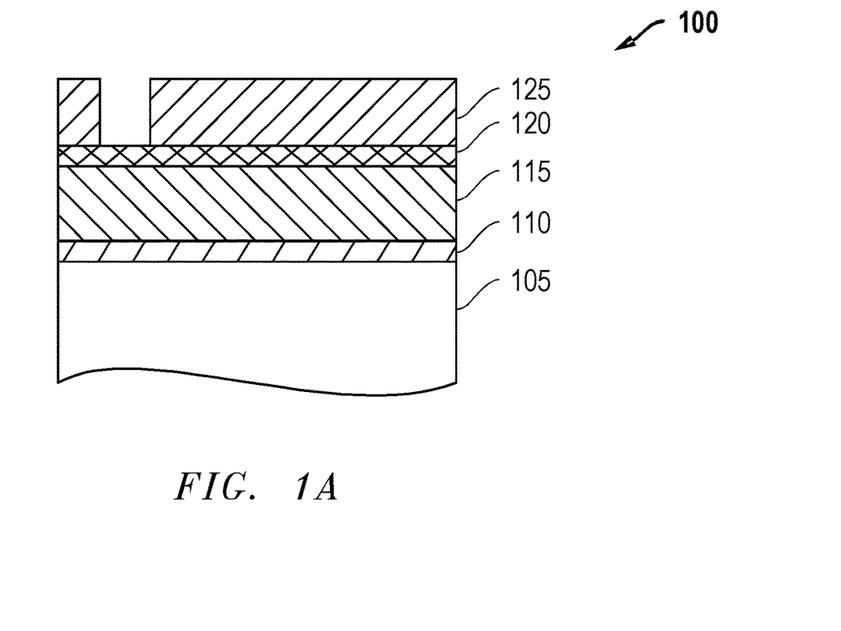
FIGS. 1A-1C illustrate a process flow utilizing a thermal decomposition layer.

The figures provided herein illustrate the use of the techniques for removal an intervening layer without damaging an underlying etched layer. As shown in the figures, the exemplary use of this process is a multiple patterning process. As mentioned above, the techniques described herein are not, however, limited to a multiple patterning process. One embodiment of a process integration flow utilizing the thermal decomposition techniques described herein is shown in FIGS. 1A-3C. As shown in FIG. 1A, a structure 100 is provided. The structure 100 includes a substrate 105. Substrate 105 may be any substrate for which the use of patterned features is desirable. For example, in one embodiment, substrate 105 may be a semiconductor substrate having one or more semiconductor processing layers formed thereon. In one embodiment, the substrate 105 may be a substrate that has been subject to multiple semiconductor processing steps which yield a wide variety of structures and layers, all of which are known in the substrate processing art. In one exemplary embodiment, the structure 100 may be used as part of a triple patterning technique utilized at a back end of line (BEOL) processing step or a front end of line (FEOL) processing step for processing a semiconductor wafer.

A layer to be etched as part of the multi-patterning process is also provided. In this example, the layer to be etched is memorization layer 110. A photo resist layer 125 may also be formed and patterned above the memorization layer 110. As shown in FIG. 1A, the photo resist layer 125 may be formed to have a pattern of lines, spaces and/or vias. Between the photo resist layer 125 and the memorization layer 110, one or more intervening layers may be provided. In the exemplary process shown, two intervening layers may be utilized. It will be recognized that the intervening layers may be any of a wide variety of layers, for example, antireflective coating layers, hard mask layers, planarization layers etc. As shown in the example of FIG. 1A, one of the intervening layers is a planarization layer. In prior art techniques, the planarization layer may be an organic planarization layer that that may require use of a reactive ion etch to remove the organic planarization layer. In contrast, in the embodiment of FIG. 1A, the intervening layers include a thermal decomposition layer 115, in this embodiment forming the planarization layer. Next, as shown in FIG. 1A, An additional layer 120 is also provided. Additional layer 120 may be one or more of a hard mask layer, an antireflective coating layer, or any other layer utilized in the patterning process. Though not shown, additional layers may also be utilized between the thermal decomposition layer 115 and the memorization layer 110. For example, a bottom antireflective layer or other layers may be utilized between the thermal decomposition layer 115 and the memorization layer 110. Thus, it will be recognized that the particular stack of layers shown in FIG. 1A is merely exemplary and many other variations of layers may be utilized while still obtaining the benefits of the use of a thermal decomposition material as described herein.

Figure 1B:
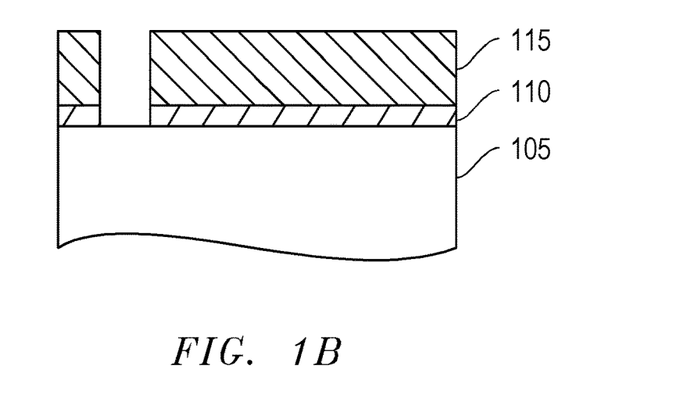
Figure 1C:
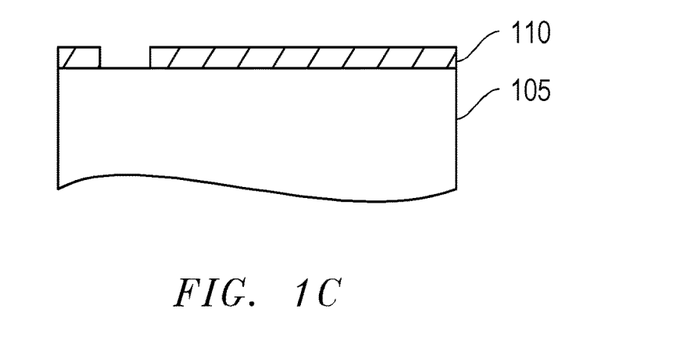

During the patterning and etch process, it is desirable to transfer the pattern of the photo resist layer 125 to the layer that is desired to be etched by multiple patterns, the memorization layer 110. FIG. 1B illustrates the transfer of the pattern of the photo resist layer 125 to memorization layer 110. Such a pattern transfer may be accomplished via a plasma etch process, though other techniques may be utilized. As shown in the figure, the photo resist layer 125 and the additional layer 120 have been removed. Such removal may be result of the standard lithography-etch-strip process techniques known in the art. As shown, the thermal decomposition layer 115 remains on the substrate 105. Next as shown in FIG. 1C, the thermal decomposition layer 115 may be removed by the application of thermal energy. As mentioned above, such application of thermal energy may be achieved by a variety of manners, including but not limited to heating of the ambient around the thermal decomposition layer, by the use of lasers, microwaves, etc. Due to the nature of the thermal removal process, the removal of the thermal decomposition layer 115 may be achieved without causing damage to the memorization layer 110. For example, profile changes to the memorization layer 110 may be minimized as compared to damage to the memorization layer 110 that may result if the intervening planarization layer was removed by an etch such as a reactive ion etch.

In one exemplary embodiment, the thermal decomposition layer 115 may be removed by subjecting the layer to a heating process of less than 400° Celsius (C). In another embodiment, the heating process may be in the range of 100°-350° C. and in a yet another embodiment, between 200°-260° C. In one embodiment, the thermal decomposition layer removal process may occur by applying heat for five minutes. It will be recognized, however, that other temperatures and times may be utilized.

Figure 2A:
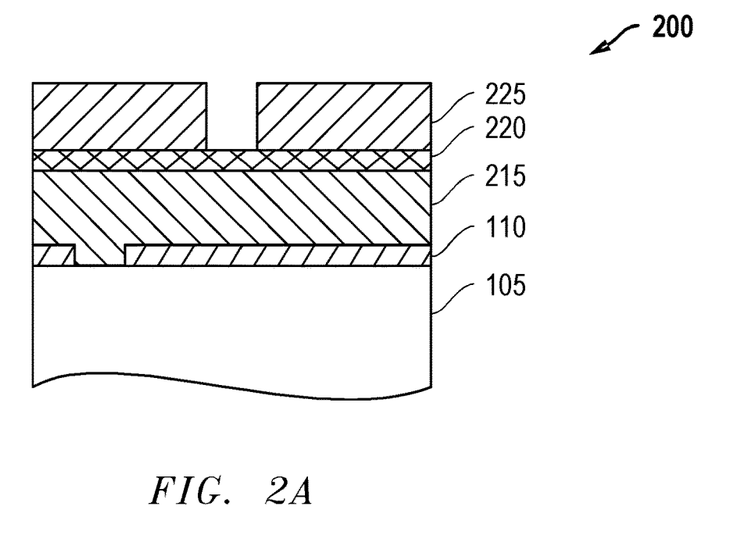
FIGS. 2A-2C illustrate a process flow adding the use of a second patterning process to the process flow of FIGS. 1A-1C.
Figure 2B:
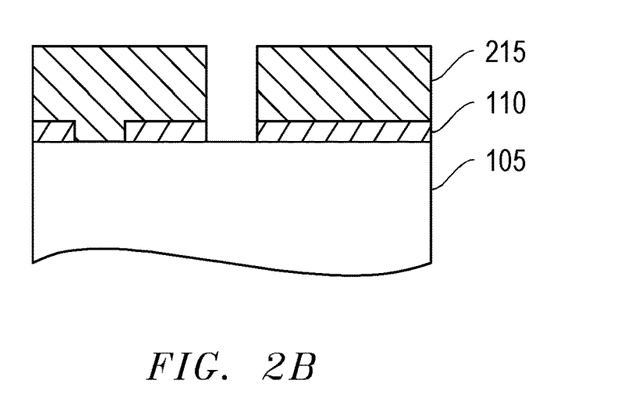
Figure 2C:
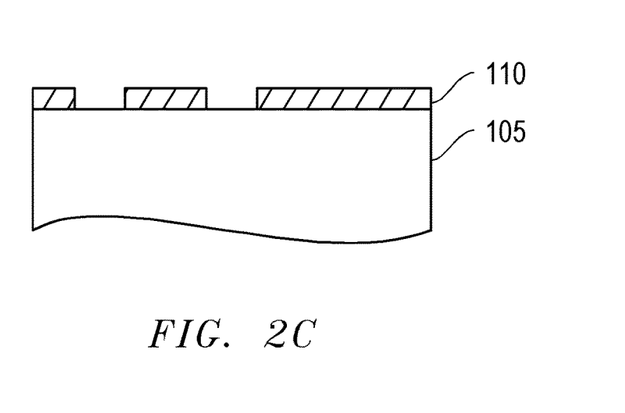
Figure 3A:
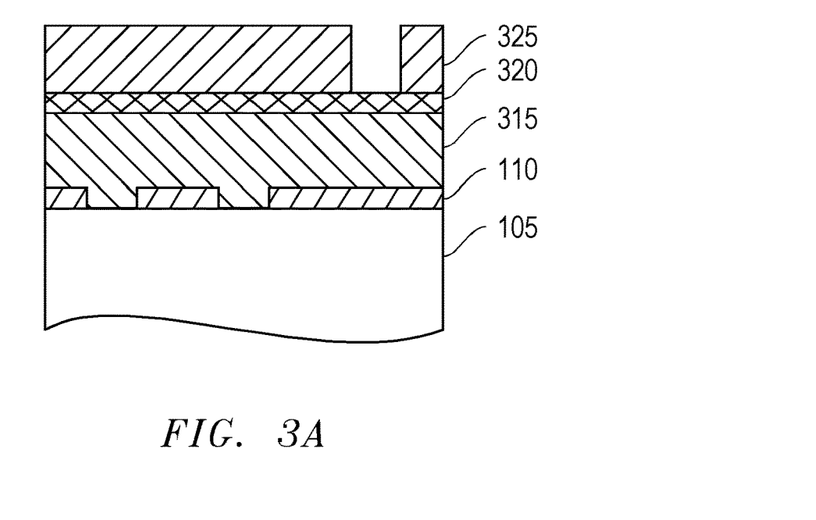
FIGS. 3A-3C illustrate a process flow adding the use of a third patterning process to the process flow of FIGS. 2A-2C.
Figure 3B:
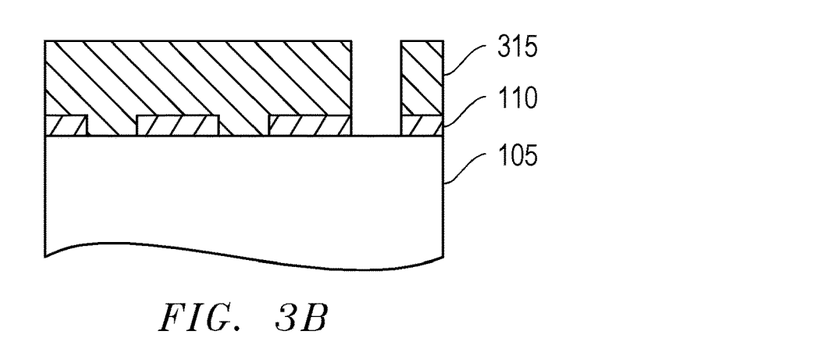
Figure 3C:
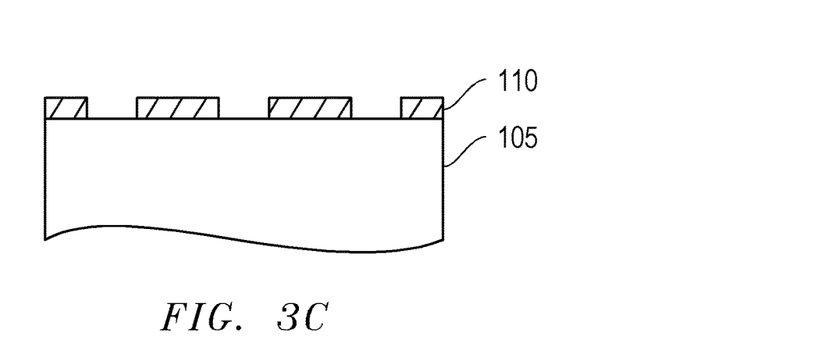

The process described above may be used alone at a variety of process steps utilized in a substrate process flow. In one exemplary embodiment, the process described above may be part of a multiple patterning process (however, as mentioned the techniques described herein are not limited to multiple patterning processes). Use within a multiple patterning process is shown below with regard to FIGS. 2A-2C and 3A-3C, process steps which may be used after the steps of FIG. 1A-1C described above. More particularly, FIGS. 2A-2C show the use of second patterning steps and FIGS. 3A-3C show the use of third patterning steps. The processes described above for FIG. 1 are replicated so that second and third patterns are formed in the memorization layer as shown in FIGS. 2A-2C and 3A-3C. More specifically, as shown in FIG. 2A, a structure 200 may include a second photo resist layer 225, a second additional layer 220, and a second thermal decomposition layer 215 provided above the memorization layer 110 that results from FIG. 1C. As shown in FIG. 2B, the second thermal decomposition layer 215 and memorization layer 110 may then be etched according to the pattern of the second photo resist layer 225. Next as shown in FIG. 2C, the second thermal decomposition layer 215 may be removed by a thermal process as discussed above. Thus, as shown in FIG. 2C, the patterns of photo resist layer 125 and second photo resist layer 225 are transferred to the memorization layer 110 and the second thermal decomposition layer is removed by a second heat treatment process.

The process of FIGS. 2A-2C may be replicated another time as shown in FIGS. 3A-3C. More specifically, as shown in FIG. 3A, a structure 300 may include a third photo resist layer 325, a third additional layer 320, and a third thermal decomposition layer 315 provided above the memorization layer 110 that results from FIG. 2C. In the example shown, the third thermal decomposition layer 315 operates as a third planarization layer. As shown in FIG. 3B, the third thermal decomposition layer 315 and memorization layer 110 may then be etched according to the pattern of the third photo resist layer 325. Next as shown in FIG. 3C, the third thermal decomposition layer 315 may be removed by a thermal process as discussed above. Thus, as shown in FIG. 3C, the patterns of photo resist layer 125, second photo resist layer 225, and third photo resist layer 325 are transferred to the memorization layer 110. In this manner repeated etching of the memorization layer 110 provides the final pattern in the memorization layer. In the example shown, a third pattern is added to the memorization layer through use of a third patterned layer (the third photo resist layer 325).

FIGS. 2A-2C and 3A-3C show the use of additional thermal decomposition layers acting as planarization layers between photo resist layers and the memorization layer. As shown both additional layers act as a planarization layer, although it will be recognized that the thermal decomposition layers are not limited to planarization layers. As with FIGS. 1A-1C, the thermal decomposition layers may be removed via the application of thermal energy in a manner that minimizes damage to the memorization layer. In this manner, a triple patterning process which requires the removal of three planarization layers may be accomplished without damaging the memorization layer by the removal of those three planarization layers. Further, as shown in FIGS. 1A-1C, the first thermal decomposition layer depolymerizes through the application of heat. Further, in the embodiment that includes FIGS. 1A-2C, the first thermal decomposition layer and the second thermal decomposition layer both depolymerize by thermal treatment as does each subsequent thermal decomposition layer (such as in FIGS. 3A-3C). However, it will be recognized that benefits of the techniques described herein may still be obtained in the techniques are only used at some of the multi patterning steps as opposed to all steps.

In one embodiment, the thermal decomposition layer may be comprised of a material such a urea binding resin, specifically polyurea, which has depolymerizability and has characteristics that it can be removed by thermal treatment of less than 400° C., and in another embodiment by thermal treatment of less than 300° C. Thus, through the application of thermal energy the layer depolymerizes. By using such thermal decomposition materials, as opposed to standard organic planarization layers, the exposure of the memorization layer to the etching processes at the time of organic planarization removal is eliminated. Because the thermal decomposition layer can be removed by thermal treatment, the influence on the memorization layer of the removal process can be eliminated. Therefore, the shape of the memorization layer can be maintained even after multiple lithography and etching processes. Thus, by making the planarization layer a thermal decomposition material, the use of a reactive ion etch process to remove the planarization layer becomes unnecessary and shape changes of the memorization layer can be suppressed. Therefore, it is possible to suppress shape deterioration of the memorization layer even if patterning is performed multiple times.

The techniques described herein are not limited to a particular thermal decomposition material, as a variety of materials may be utilized while still obtaining the benefit of utilizing a thermal removal process so that the memorization layer is not damaged. However, as discussed above, in one embodiment a urea binding resin may be utilized. One specific embodiment of such a urea binding resin is polyurea which may be formed via a thin film deposition. An exemplary technique for the formation of a polyurea and the removal of such a polyurea by a depolymerization process to thermal decompose the polyurea are described in more detail in U.S. patent application Ser. No. 15/654,307 filed Jul. 19, 2017, entitled "Method of Fabricating Semiconductor Device, Vacuum Processing Apparatus and Substrate Processing Apparatus," to Yatsuda et al., the disclosure of which is expressly incorporated herein by reference in its entirety. The techniques described in U.S. patent application Ser. No.

15/654,307 include, but are not limited to, copolymerizing isocyanate and amine as raw material monomers to form a urea bond, and as described, an exemplary a vapor deposition polymerization process may be utilized. As described in U.S. patent application Ser. No. 15/654,307, a liquid process may also be used to form the polyurea. Further, as described, the polyurea may be subsequently depolymerized to an amine and vaporized by the application of a thermal treatment. It will be recognized, however, that other formation processes and other removal processes may be utilized while still gaining the benefits of the use of a thermal decomposition layer and thermal removal of such layer as described herein. Further, it will be recognized that the techniques described herein are not limited to polyurea and other materials and/or combinations or variants of polyurea and other materials may be utilized.

Figure 4:
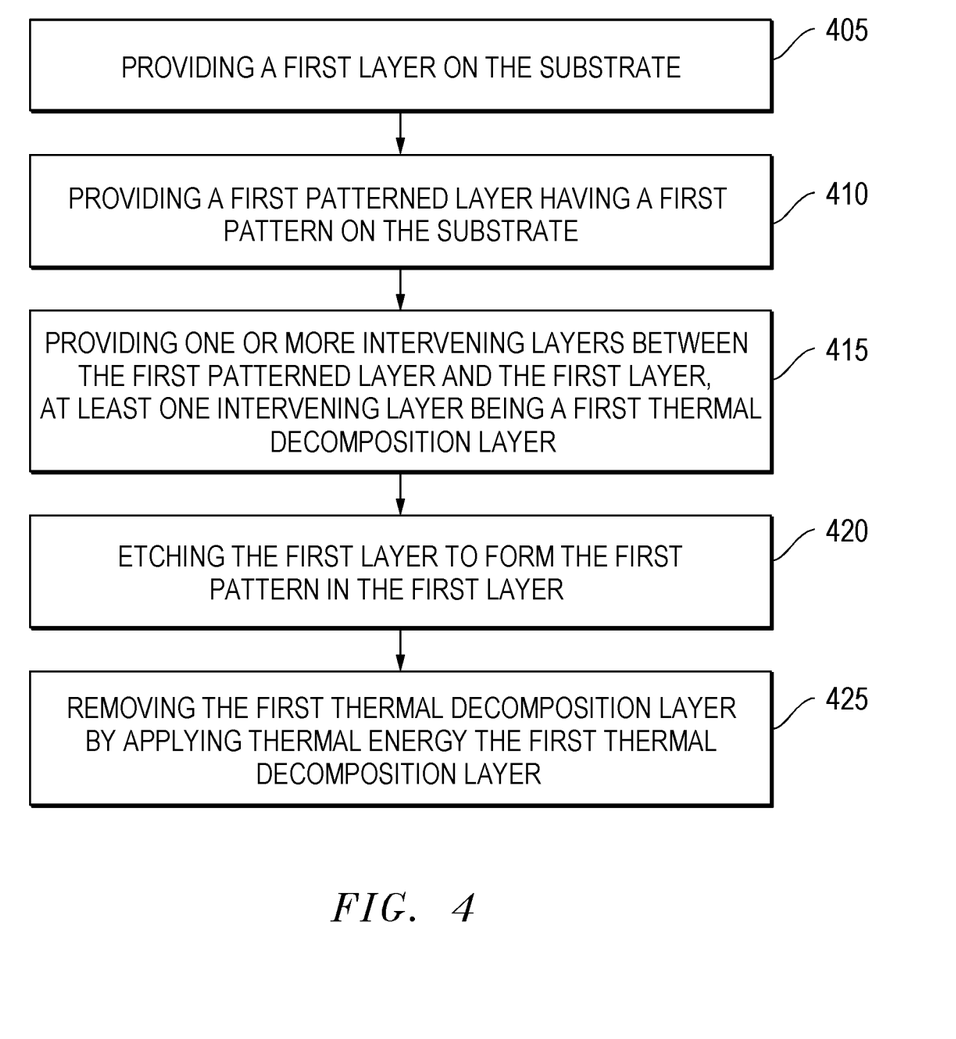
FIG. 4 illustrates an exemplary process flow for use of a thermal decomposition layer as part of a patterning process.
Figure 5:
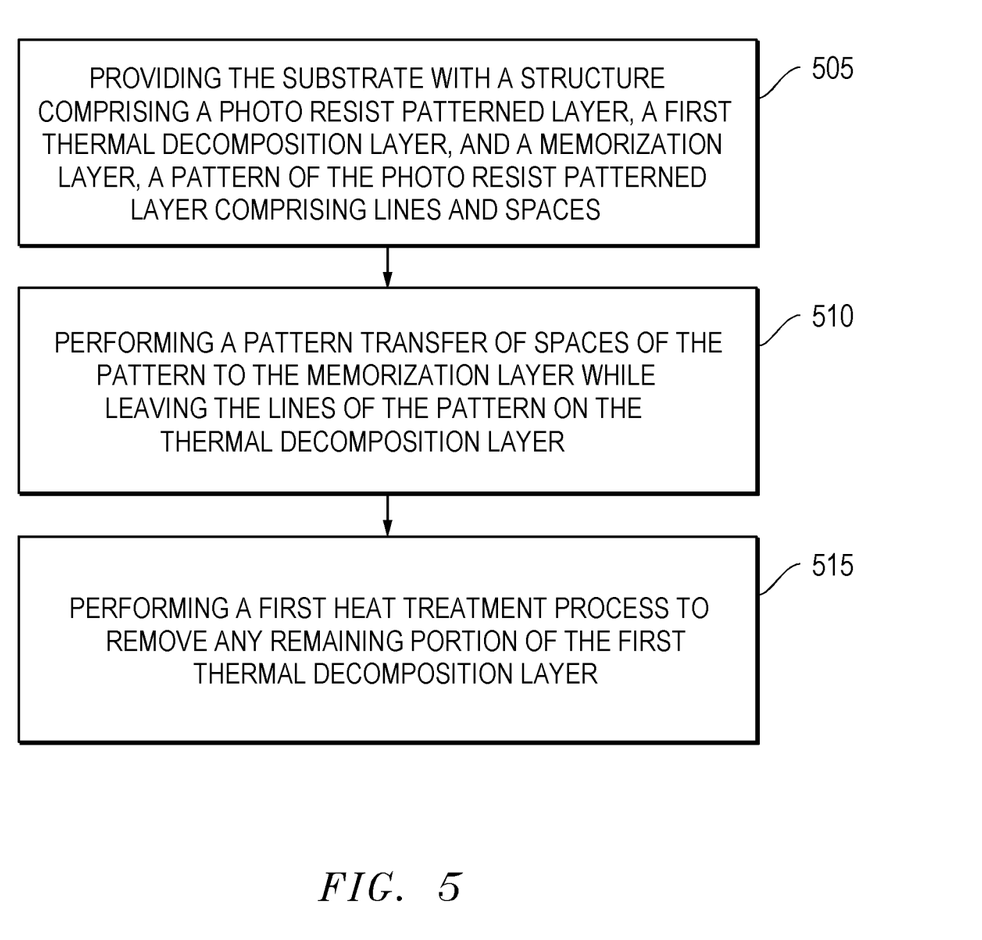
FIG. 5 illustrates another exemplary process flow for use of a thermal decomposition layer as part of a patterning process.
Figure 6:
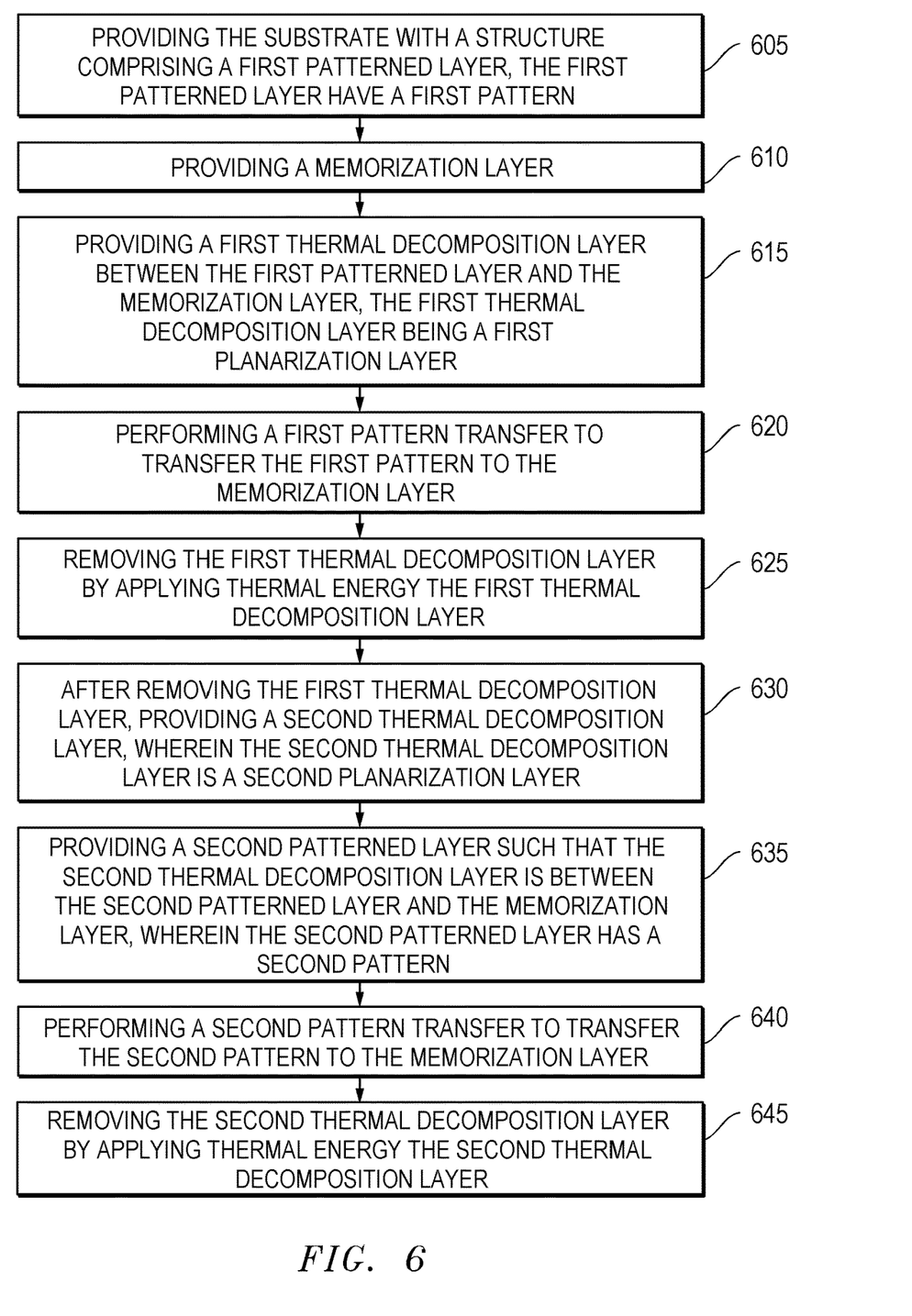
FIG. 6 illustrates yet another exemplary process flow for use of a thermal decomposition layer as part of a patterning process.

It will be recognized that the process flows described above are merely exemplary, and many other processes and applications may advantageously utilize the techniques disclosed herein. FIGS. 4-6 illustrate exemplary methods for use of the processing techniques described herein. It will be recognized that the embodiments of FIGS. 4-6 are merely exemplary and additional methods may utilize the techniques described herein. Further, additional processing steps may be added to the methods shown in the FIGS. 4-6 as the steps described are not intended to be exclusive. Moreover, the order of the steps is not limited to the order shown in the figures as different orders may occur and/or various steps may be performed in combination or at the same time.

In FIG. 4, a method of etching a substrate is shown. The method includes step 405 of providing a first layer on the substrate and step 410 of providing a first patterned layer having a first pattern on the substrate. The method further includes step 415 of providing one or more intervening layers between the first patterned layer and the first layer, at least one intervening layer being a first thermal decomposition layer. The method also includes step 420 of etching the first layer to form the first pattern in the first layer. The method further includes step 425 of removing the first thermal decomposition layer by applying thermal energy to the first thermal decomposition layer.

In FIG. 5, a method of patterning a substrate is shown. The method includes step 505 of providing the substrate with a structure comprising a photo resist patterned layer, a first thermal decomposition layer, and a memorization layer, a pattern of the photo resist patterned layer comprising lines, spaces and/or vias. The method also includes step 510 of performing a pattern transfer of spaces and/or vias of the pattern to the memorization layer while leaving the lines of the pattern on the thermal decomposition layer. The method further includes step 515 of performing a first heat treatment process to remove any remaining portion of the first thermal decomposition layer.

In FIG. 6, a method of multi-patterning a substrate is shown. The method may comprise step 605 of providing the substrate with a structure comprising a first patterned layer, the first patterned layer have a first pattern. The method also includes step 610 of providing a memorization layer. The method includes step 615 of providing a first thermal decomposition layer between the first patterned layer and the memorization layer, the first thermal decomposition layer being a first planarization layer. The method includes step 620 of performing a first pattern transfer to transfer the first pattern to the memorization layer and step 625 of removing the first thermal decomposition layer by applying thermal energy to the first thermal decomposition layer. After removing the first thermal decomposition layer, the method includes step 630 providing a second thermal decomposition layer, wherein the second thermal decomposition layer is a second planarization layer. The method further includes step 635 of providing a second patterned layer such that the second thermal decomposition layer is between the second patterned layer and the memorization layer, wherein the second patterned layer has a second pattern. The method also includes step 640 of performing a second pattern transfer to transfer the second pattern to the memorization layer and step 645 of removing the second thermal decomposition layer by applying thermal energy to the second thermal decomposition layer.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and describe herein and certain features of the inventions may be utilized independently of the use of other features, all as would be apparent to one skilled in the art after having the benefit of this description of the inventions.

What is claimed is:

1. A method of etching a substrate, the method comprising:
   providing a first layer on the substrate;
   providing a first patterned layer having a first pattern on the substrate;
   providing one or more intervening layers between the first patterned layer and the first layer, at least one intervening layer being a first thermal decomposition layer;
   etching the first layer to form the first pattern in the first layer; and
   removing the first thermal decomposition layer by applying thermal energy to the first thermal decomposition layer in a thermal treatment step,
   wherein the method of etching the substrate is a multiple patterning process, the multiple patterning process comprising repeated etching of the first layer to form multiple patterns in the first layer, and
   wherein the first thermal decomposition layer is material that depolymerizes through application of thermal energy in the thermal treatment step at a temperature of 400° C. or less such that the first thermal decomposition layer is depolymerized and removed by the thermal treatment step.

2. The method of claim 1, wherein the first thermal decomposition layer depolymerizes and is removed by thermal treatment in the thermal treatment step at 260° C. or less.

3. The method of claim 1, wherein the first thermal decomposition layer is comprised of a urea binding resin.

4. The method of claim 1, further including, prior to removing the first thermal decomposition layer, performing an etch strip to remove the first patterned layer.

5. The method of claim 1, wherein the method comprises, after removing the first thermal decomposition layer, forming a second thermal decomposition layer and removing the second thermal decomposition layer by applying thermal energy to depolymerize and remove the second thermal decomposition layer at a temperature of 400° C. or less.

6. The method of claim 5, wherein the first layer is a memorization layer.

7. A method of patterning a substrate, the method comprising:
provinding the substrate with a structure comprising a photo resist patterned layer, a first thermal decomposition layer, and a memorization layer, a pattern of the photo resist patterned layer comprising lines, spaces and/or vias;
performing a pattern transfer of spaces and/or vias of the pattern to the memorization layer while leaving the lines of the pattern on the first thermal decomposition layer; and
performing a first heat treatment process to remove any remaining portion of the first thermal decomposition layer,
wherein the first thermal decomposition layer is material that depolymerizes through application of thermal energy in the first heat treatment process at a temperature of 400° C. or less to depolymerize and remove the first thermal decomposition layer.

8. The method of claim 7, wherein the first thermal decomposition layer is comprised of a urea binding resin.

9. The method of claim 7, wherein the first thermal decomposition layer is a planarization layer.

10. The method of claim 7, further including, prior to performing the first heat treatment process, performing an etch strip to remove the photo resist patterned layer.

11. The method of claim 7, wherein the method of patterning the substrate is a multiple patterning process, the multiple patterning process comprising transferring more than one pattern to the memorization layer.

12. The method of claim 11, wherein the method comprises, after removing any remaining portion of the first thermal decomposition layer, forming a second thermal decomposition layer and removing the second thermal decomposition layer by using a second heat treatment process which depolymerizes and removes the second thermal decomposition layer at a temperature of 400° C. or less.

13. A method of patterning a substrate, the method comprising:
providing the substrate with a structure comprising a photo resist patterned layer, a first thermal decomposition layer, and a memorization layer, a pattern of the photo resist patterned layer comprising lines, spaces and/or vias;
performing a pattern transfer of spaces and/or vias of the pattern to the memorization layer while leaving the lines of the pattern on the first thermal decomposition layer; and
performing a first heat treatment process to remove any remaining portion of the first thermal decomposition layer by depolymerizing the first thermal decomposition layer at a temperature of 400° C. or less to remove the first thermal decomposition layer;
wherein the method of patterning the substrate is a multiple patterning process, the multiple patterning process comprising transferring more than one pattern to the memorization layer;
wherein the method comprises forming a second thermal decomposition layer and removing the second thermal decomposition layer by using a second heat treatment process to depolymerize and remove the second thermal decomposition layer at 400° C. or less, and
wherein both the first thermal decomposition layer and the second thermal decomposition layer are planarization layers.

14. A method of multi-patterning a substrate, the method comprising:
providing the substrate with a structure comprising a first patterned layer, the first patterned layer have a first pattern;
providing a memorization layer;
providing a first thermal decomposition layer between the first patterned layer and the memorization layer, the first thermal decomposition layer being a first planarization layer;
performing a first pattern transfer to transfer the first pattern to the memorization layer;
removing the first thermal decomposition layer by applying thermal energy to the first thermal decomposition layer to depolymerize and remove the first thermal decomposition layer at a temperature of 400° C. or less;
after removing the first thermal decomposition layer, providing a second thermal decomposition layer, wherein the second thermal decomposition layer is a second planarization layer;
providing a second patterned layer such that the second thermal decomposition layer is between the second patterned layer and the memorization layer, wherein the second patterned layer has a second pattern;
performing a second pattern transfer to transfer the second pattern to the memorization layer; and
removing the second thermal decomposition layer by applying thermal energy to the second thermal decomposition layer to depolymerize and remove the second thermal decomposition layer at a temperature of 400° C. or less.

15. The method of claim 14, further including, prior to removing the first thermal decomposition layer, performing an etch strip to remove the first patterned layer.

16. The method of claim 14, wherein the first thermal decomposition layer and the second thermal decomposition layer both depolymerize and are removed by thermal treatment of 300° C. or less.

17. The method of claim 16, wherein the first thermal decomposition layer and the second thermal decomposition layer are both comprised of a urea binding resin.

18. The method of claim 17, further comprising:
after removing the second thermal decomposition layer, providing a third thermal decomposition layer, wherein the third thermal decomposition layer is a third planarization layer;
providing a third patterned layer such that the third thermal decomposition layer is between the third patterned layer and the memorization layer, wherein the third patterned layer has a third pattern;
performing a third pattern transfer to transfer the third pattern to the memorization layer; and
removing the third thermal decomposition layer by applying thermal energy to the second thermal decomposition layer to depolymerize and remove the third thermal decomposition layer at 400° C. or less.

19. The method of claim 17 wherein the application of thermal energy comprises heating of the ambient around the thermal decomposition layer, by the use of lasers, or by use of microwaves.

* * * * *